United States Patent
Kataria et al.

(10) Patent No.: US 7,711,009 B2
(45) Date of Patent: May 4, 2010

(54) METHODS AND APPARATUS FOR TIMING SYNCHRONIZATION IN PACKET NETWORKS

(75) Inventors: Deepak Kataria, Bridgewater, NJ (US); Chengzhou Li, Whitehall, PA (US)

(73) Assignee: Agere Systems Inc., Allentown, PA (US)

( * ) Notice: Subject to any disclaimer, the term of this patent is extended or adjusted under 35 U.S.C. 154(b) by 774 days.

(21) Appl. No.: 11/536,848

(22) Filed: Sep. 29, 2006

(65) Prior Publication Data

US 2008/0080563 A1 Apr. 3, 2008

(51) Int. Cl.
*H04J 3/06* (2006.01)
(52) U.S. Cl. ...................... 370/503; 375/373
(58) Field of Classification Search ................ 370/503
See application file for complete search history.

(56) References Cited

U.S. PATENT DOCUMENTS

| | | | |
|---|---|---|---|
| 7,409,020 B1 * | 8/2008 | Wyrzykowska et al. | 375/350 |
| 2002/0186681 A1 * | 12/2002 | Martin | 370/350 |
| 2003/0056136 A1 * | 3/2003 | Aweya et al. | 713/400 |

OTHER PUBLICATIONS

J. Aweya et al., "Circuit Emulation Services Over Ethernet—Part 1: Clock Synchronization Using Timestamps," International Journal of Network Management, 2004, pp. 29-44, vol. 14, No. 1.

* cited by examiner

*Primary Examiner*—Derrick W Ferris
*Assistant Examiner*—Mang Yeung
(74) *Attorney, Agent, or Firm*—Ryan, Mason & Lewis, LLP

(57) ABSTRACT

Methods and apparatus for synchronizing a first clock of a transmit node and a second clock of a receive node in a packet network are provided. Receive time stamps are generated for transferred packets at a receive node in-accordance with the second clock. Propagation delay variation is filtered from receive time stamp intervals through a filter in accordance with a frequency of the second clock. The filtered receive time stamp intervals and transmit time stamp intervals of the transferred packets are input into a phase locked loop to generate a new frequency for the second clock. The filter and the second clock are updated in accordance with the new frequency for synchronization with the first clock of the transfer node.

20 Claims, 4 Drawing Sheets

METHODS AND APPARATUS FOR TIMING SYNCHRONIZATION IN PACKET NETWORKS

FIELD OF THE INVENTION

The present invention relates generally to packet transfer networks and, more particularly, to timing synchronization over packet transfer networks.

BACKGROUND OF THE INVENTION

During operation, telecommunication equipment requires timing synchronization for proper communication purposes. Traditional synchronization methods utilize expensive specialized circuits to provide synchronization signals. Currently, with the prevalence of packet networks, such as, for example, Ethernet, cost can be reduced for timing synchronization by transmitting timing synchronization signals between telecommunication equipment within the packet network. However, due to the store-and-forward operation of packet networks, the synchronization signals or messages will experience an uncertain delay, which will affect the accuracy of synchronization. This uncertainty in delay is commonly referred to as packet delay variation (PDV). To improve timing synchronization accuracy, it is necessary for such delay to be significantly reduced or eliminated.

There are two known categories of methods for providing timing synchronization with reduced PDV. These categories include probabilistic filtering algorithms and long time averaging.

A probabilistic filtering algorithm filters out any large packet delays and uses the small packet delays for calculation of correction factors and timing synchronization of a local clock of a receive node with a transmit clock of a transmit node. This method usually has high complexity. The process of obtaining satisfactory small delays for calculation is random, therefore, successful performance of the probabilistic filtering algorithms in the short-term is not guaranteed.

In a second category, long time averaging provides a method that averages the delay of multiple transferred packets in order to eliminate the PDV. However, in an actual system, obtaining an absolute time is difficult because the local clock of the receive node is not accurate and requires synchronization. Any adjustment of the local clock may adversely affect the result of the delay averaging. Moreover, this method is not flexible, in that the result of the averaging cannot be controlled.

SUMMARY OF THE INVENTION

The present invention provides a two-parameter low pass filter with feedback control that provides a simple and efficient way to filter PDV of transferred packets.

In accordance with one aspect of the invention, a method of synchronizing a first clock of a transmit node and a second clock of a receive node in a packet network is provided. Receive time stamps are generated for transferred packets at a receive node in accordance with the second clock. Propagation delay variation is filtered from receive time stamp intervals through a filter in accordance with a frequency of the second clock. The filtered receive time stamp intervals and transmit time stamp intervals of the transferred packets are input into a phase locked loop to generate a new frequency for the second clock. The filter and the second clock are updated in accordance with the new frequency for synchronization with the first clock of the transfer node.

In an illustrative embodiment, receive time stamp intervals may be determined in accordance with the receive time stamps and the second clock. The generating, filtering, inputting and updating steps may also be repeated for the continuously transferred packets.

In an additional embodiment, the filter may be a double exponentially weighted moving average filter having one or more weight factors, one or more delay blocks, and one or more state machines. Further, the phase locked loop may be a digital phase locked loop having a phase detector, a loop filter and a numerically controlled oscillator.

In accordance with another aspect of the present invention a receive node is provided having a clock generator for generating a first clock. A processor of the receive node is configured to generate receive time stamps for transferred packets at the receive node in accordance with the first clock. A filter of the receive node is configured to filter propagation delay variation from receive time stamp intervals in accordance with a frequency of the first clock. A phase locked loop of the receive node is configured to receive the filtered receive time stamp intervals and transmit time stamp intervals of the transferred packets and generate a new frequency for the first clock. The filter and the first clock are updated in accordance with the new frequency for synchronization with a clock of a transmit node, These and other features and advantages of the present invention will become apparent from the following detailed description of illustrative embodiments thereof, which is to be read in connection with the accompanying drawings.

DETAILED DESCRIPTION

As will be described in detail below, the present invention in the illustrative embodiment relates generally to the field of packet transfer networks and, more particularly, to improved techniques for the synchronization of a first clock source and a second clock source over packet networks having propagation delay. The illustrative embodiment of the present invention introduces a two-parameter low pass filter with feedback control that provides a simple and efficient way to filter PDV of transferred packets.

Figure 1:
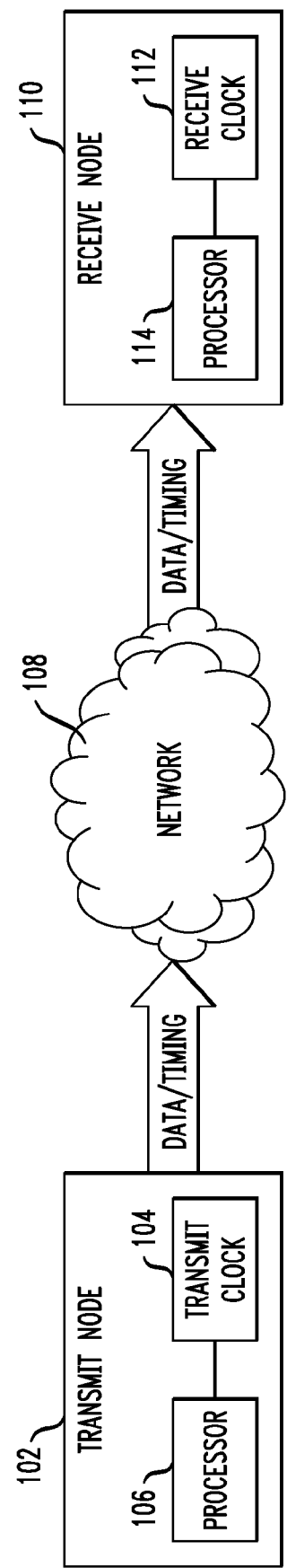
FIG. 1 is a diagram illustrating a packet transfer network, according to an embodiment of the present invention.

Referring initially to FIG. 1, a diagram illustrates a packet transfer system, according to an embodiment of the present invention. A transmit node 102 includes a transmit clock 104, or master clock, in communication with a transmit node processor 106. Packets for transfer may be stored in a transfer queue of transmit node and time stamped at transmit node 102 in accordance with transmit clock 104 and transmit node processor 106. The packets, which include data and timing information, are transferred through a network 108 to a receive node 110. Receive node 110 includes a receive clock 112, or slave clock, in communication with a receive node processor 114. The packets are time stamped again at receive node 110 in accordance with receive clock 112 and receive node processor 114. Time stamps are provided in accordance with the embodiments of the present invention which synchronize transmit clock 104 and receive clock 112 and eliminate PDV of the transferred packets.

Figure 2:
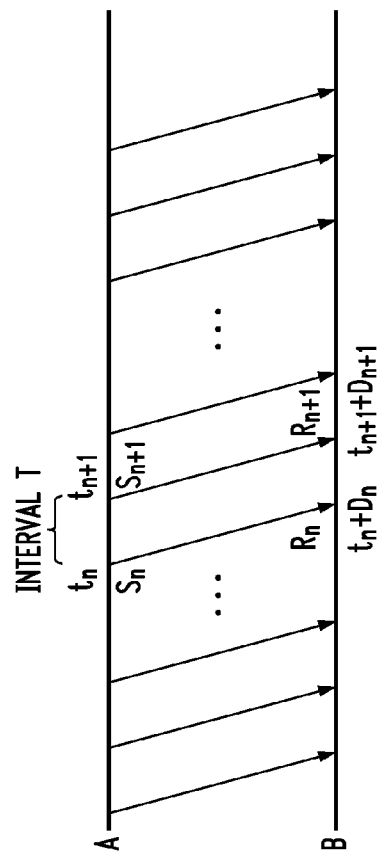
FIG. 2 is a diagram illustrating unidirectional time stamped packet transfer, according to an embodiment of the present invention.

Referring now to FIG. 2, a diagram illustrates unidirectional time stamped packet transfer, according to an embodiment of the present invention. FIG. 2 allows for the synchronization of a clock of receive node B with a clock of transmit node A. At times $t_n$ and $t_{n+1}$, the $n^{th}$ and $(n+1)^{th}$ time stamped packets receive time stamp values $S_n$ and $S_{n+1}$ from in accordance with a clock of transmit node A. After some delay, these two time stamped packets arrive at receive node B at times $t_n+D_n$ and $t_{n+1}+D_{n+1}$. Receive node B then derives its own time stamps for the transferred packets in accordance with an arrival time of the local clock, $R_n$ and $R_{n+1}$. The time stamps of the transferred packets are related to the frequency of transmit node A, $f_A$, and the frequency of receive node B, $f_B$, by the following equations:

$$\Delta S_{n+1} = S_{n+1} - S_n = f_A(t_{n+1} - t_n) = f_A T \quad (1)$$

$$\Delta R_{n+1} = R_{n+1} - R_n = f_B(t_{n+1} + D_{n+1} - t_n - D_n) = f_B(T + PDV_{n+1}) \quad (2)$$

where $PDV_{n+1} = D_{n+1} - D_n$.

Let $\Delta f = f_B - f_A$ be the frequency offset between receive and transmit clocks at time $t_{n+1}$. If in equation (2), PDV is removed, the ratio of the frequencies of transmit node A and receive node B is then obtained by:

$$\frac{f_A}{f_B} = \frac{f_B + \Delta f}{f_B} = 1 + \frac{\Delta f}{f_B} = \frac{\Delta R_{n+1}}{\Delta S_{n+1}} \quad (3)$$

However, since PDV can be as large as 2 ms in packet networks such as those illustrated in FIGS. 1 and 2, huge errors may result if equation (3) is applied.

The existing averaging algorithms described above assume that the time stamp difference $\Delta R_{n+1}$ is known in terms of real time, T+PDV. Thus, by averaging $\Delta R_{n+1}$, T is obtained as:

$$T = E(\Delta R_n) = E(T + PDV) \quad (4)$$

since the average of PDV is equal to 0.

If the $\Delta R_{n+1}$ is measured by local clock and the resulting frequency difference in equation (3) is used to adjust the local clock, the above averaging method will produce an unexpected result, such as, for example, the system becoming unstable.

This averaging may be regarded as a type of low pass filter, however it is in a fixed form without any parameter to control its behavior. When the filter has a small bandwidth, it has large time constant. Therefore, the adjustment in local frequency will take long time to be reflected in the output of this low pass filter. The consequence is that the local frequency $f_B$ will be over-adjusted. The system will be in an unstable state with the $f_B$ oscillating in a large range around its nominal frequency.

Figure 3:
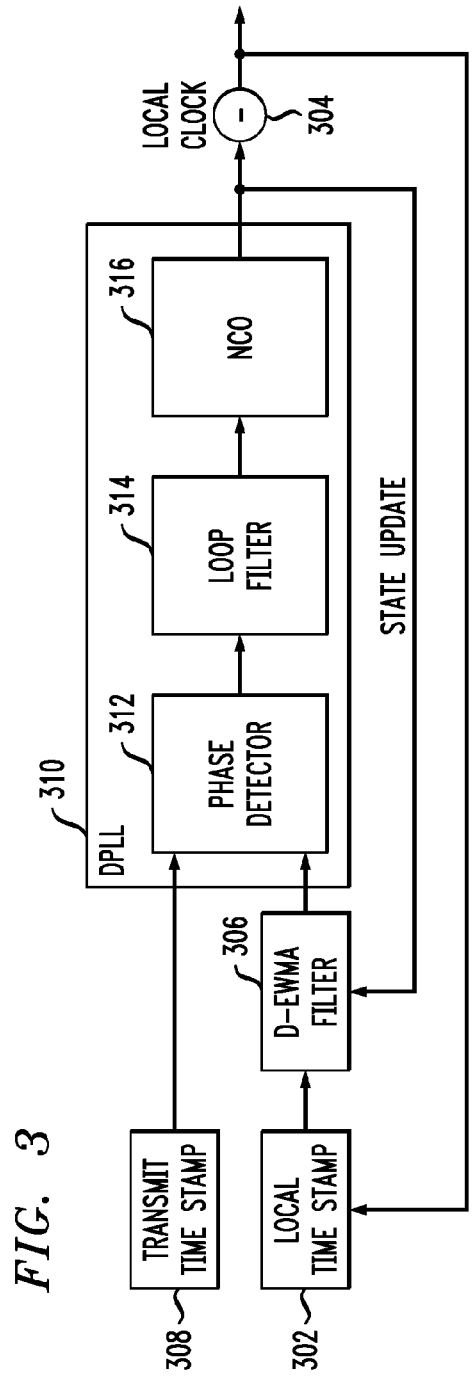
FIG. 3 is a block diagram illustrating a clock synchronization system for a packet transfer network, according to an embodiment of the present invention.

Referring now to FIG. 3, a block diagram illustrates a clock synchronization system for a packet transfer network, according to an embodiment of the present invention. Such as system is utilized in accordance with transferred time stamped packets and a local clock of the receive node. A receive time stamp, $R_n$, is generated at block 302 for a transferred time stamped packet through the measurement of a receive time stamp interval using a local clock 304. More specifically the receive time stamp is calculated for the transferred time stamped packet using the local clock as well as the last receive time stamp provided for the last transferred time stamped packet.

Figure 4:
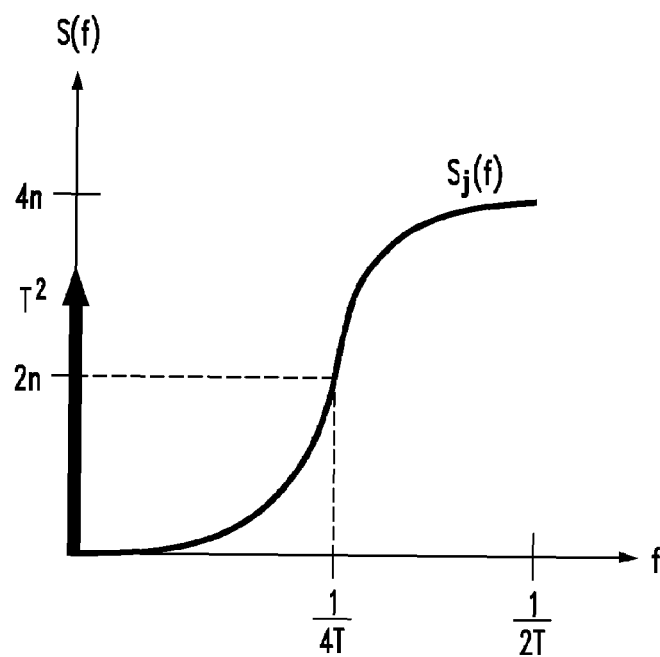
FIG. 4 is a chart illustrating the power spectrum density of T+PDV.

As described above, the continuously transferred time stamped packet intervals include PDV. Therefore, as receive time stamps for transferred time stamped packets are continuously provided, a double exponentially weighted moving average (D-EWMA) filter 306 is utilized to filter out the PDV from the receive time stamp intervals. D-EWMA filter 306 is a low pass filter (LPF). A LPF is utilized to filter out PDV due to the fact that most of the power of PDV is located in its high frequency range. FIG. 4 is a chart that plots the power spectrum density of T+PDV. As a low pass filter, low frequencies are passed, but frequencies higher than a cutoff are attenuated or reduced.

The filtered receive time stamp intervals and a transmit time stamp interval 308 are input to a digital phase locked loop (DPLL) 310. DPLL 310 is a closed-loop feedback control system that generates and outputs a signal in relation to a frequency and phase of an input signal. DPLL 310 responds both to the frequency and phase of the input signals, automatically raising or lowering the frequency of a controlled oscillator until it is matched to the reference in both frequency and phase. DPLL 310 includes a phase detector 312, a loop filter 314 and a numerically controlled oscillator 316.

DPLL 310 outputs an updated local clock frequency used to adjust local clock 304. In order to overcome the problem of instability described above with regard to existing averaging algorithms, the output clock frequency from DPLL 310 is used to update the state of D-EWMA filter 306, thereby providing a dynamic adjustment to the filter cutoff for PDV. The updated local clock frequency is also utilized in providing receive time stamps.

Figure 5:
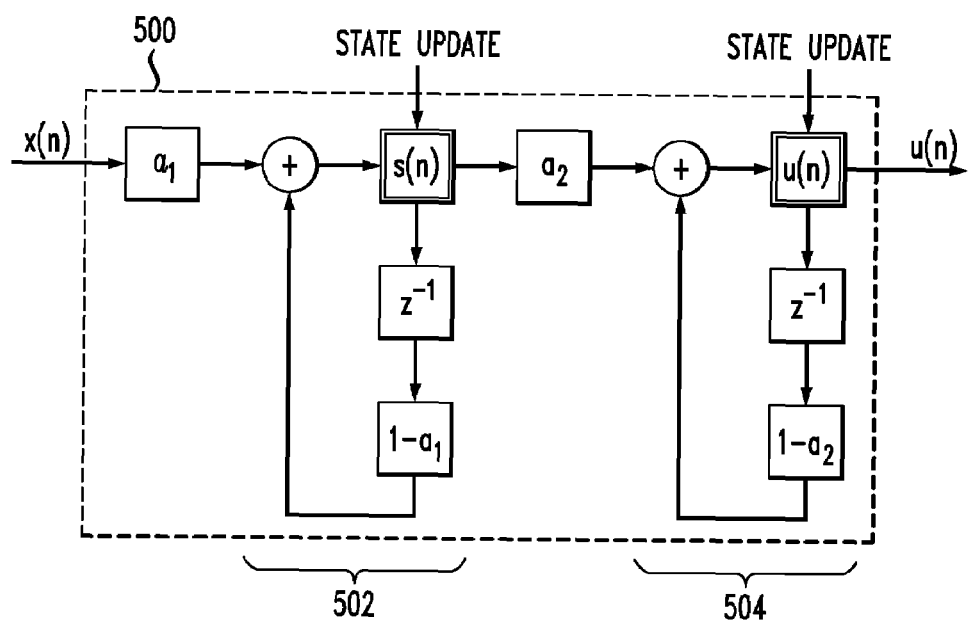
FIG. 5 is a block diagram illustrating a low pass filter for a clock synchronization system in a packet transfer network, according to an embodiment of the present invention.

Referring now to FIG. 5, a block diagram illustrates a D-EWMA filter for a clock synchronization system in a packet transfer network, according to an embodiment of the present invention. An individual EWMA applies weighting factors that decrease exponentially. More specifically, the weighting decreases by a factor, or percentage, of the previous. A receive time stamp x(n) is fed into D-EWMA filter 500, at time n. A first exponentially weighted moving average (EWMA) filter 502 continuously utilizes receive time stamps x(n), a weight $a_1$, a state machine s(n), a delay block $z^{-1}$ and a state update from DPLL to provide a result for use in a second EWMA filter 504. Second filter utilizes a second weight $a_2$ in combination with a state machine u(n), a delay block $z^{-1}$ and a state update from DPLL in a similar configuration to produce a receive time stamp interval output without PDV. The state update from the local clock frequency is provided to both EWMA filters 502, 504. If the state update is ignored, the transfer function of D-EWMA is:

$$H(z) = \frac{a_1 a_2}{(1-a_1)(1-a_2)z^{-2} + (a_1 + a_2 - 2)z^{-1} + 1} \quad (5)$$

Smaller $a_1$ and $a_2$ will result in smaller bandwidth. Choosing different parameters will result in different bandwidths, which also affects the system's dynamic response.

Suppose that the DPLL changes the local frequency $f_B$ by:

$$f_B(n+1) = f_B(n) \cdot \zeta \quad (6)$$

The corresponding state update on the D-EWMA filter will be:

$$s(n) \Leftarrow s(n) \cdot \zeta$$

$$u(n) \Leftarrow u(n) \cdot \zeta \quad (7)$$

The above update can be intuitively explained as constant component jump. In the ideal case, the output of low pass filter should only keep its constant component. With the change of local frequency, such constant component is then changed and must be immediately updated in the filter. A low pass filter alone will take long time to provide such an update as described above. Therefore, this state update forces the filter to make a sudden jump which will eliminate the oscillation of frequency adjustment.

Figure 6:
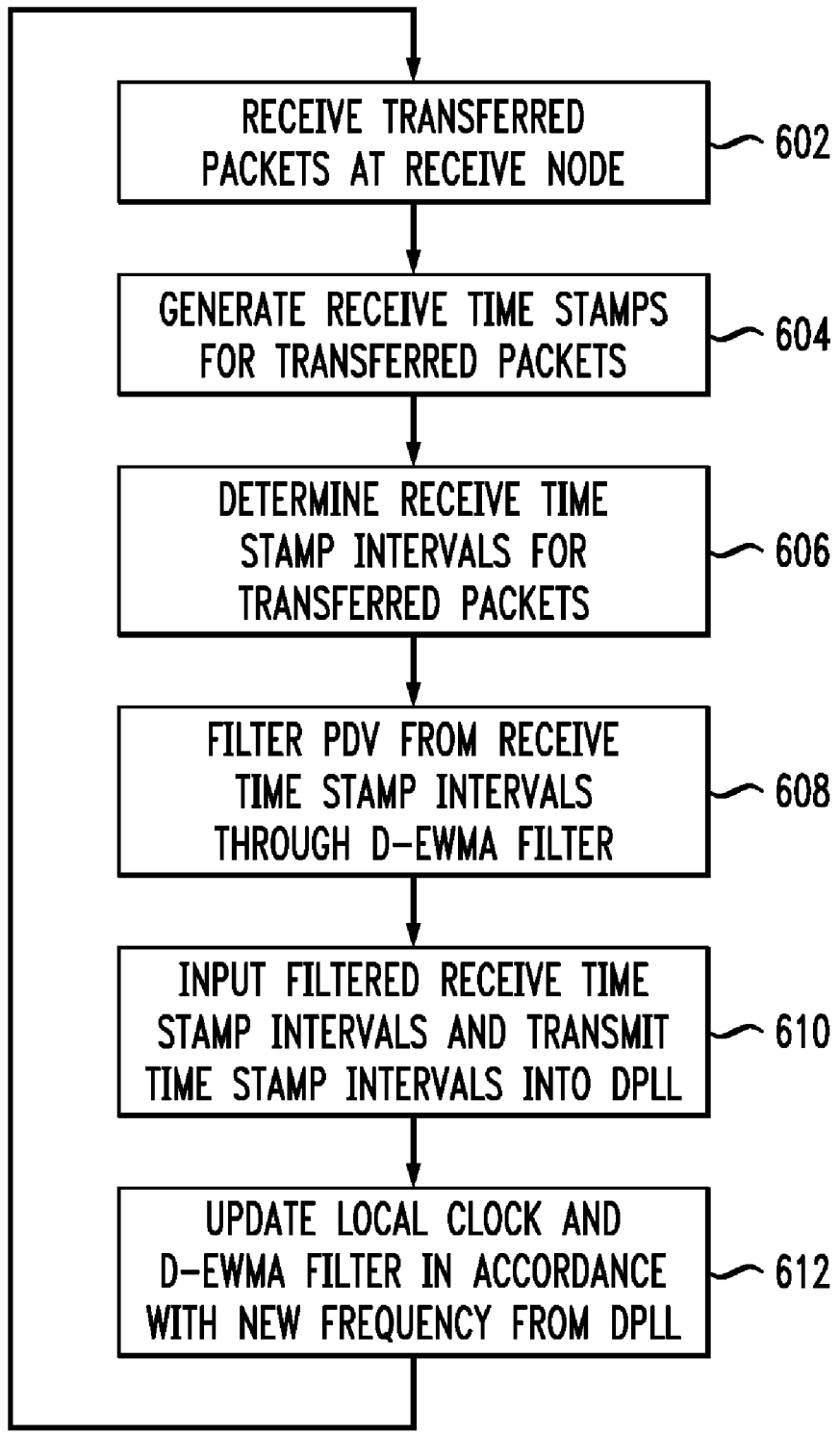
FIG. 6 is a flow diagram illustrating a clock synchronization methodology in a packet transfer network, according to an embodiment of the present invention.

Referring now to FIG. 6, a flow diagram illustrates a clock synchronization methodology in a packet network, according to an embodiment of the present invention. The methodology begins in block 602 where a transferred packets are continuously received at a receive node of a packet transfer network. In block 604, a local clock provides receive time stamps for the transferred packets. In block 606, receive time stamp intervals are determined for the transferred packets in accordance with the local clock and previous receive time stamps for previously transferred packets.

In block 608, propagation variation delay of the receive time stamp intervals are filtered out through a D-EWMA filter. The D-EWMA filter is updateable in accordance with a frequency of the local clock. In block 610, the filtered receive time stamp intervals and transmit time stamp intervals are input to a DPLL to output a new local clock frequency. In block 612, the D-EWMA filter and the local clock are updated in accordance with the new local clock frequency. The methodology then returns to block 602 for repetition of the methodology in accordance with the updated local clock and D-EWMA filter for the continuously arriving transferred packets at the receive node.

The embodiment of the present invention illustrates the use of a D-EWMA filter with feedback control in unidirectional timing transport over packet networks. However, its utilization can be applied to any situation where the PDV is required to be filtered to update the frequency or phase of a local clock. The D-EWMA filter with feedback control has a simple implementation and provides efficient PDV filtering.

This embodiment of the present invention can be integrated into hardware (DPLL) without any interference from software. But due to the feedback update on the D-EWMA filter, the frequency of a transmit node may be intentionally changed to introduce large PDV, for observation of the output frequency at the receive node.

The present invention may be implemented in the form of one or more integrated circuits or computer programs. For example, a given system node in accordance with the invention may be implemented as one or more integrated circuits comprising at least one processor and at least one memory. Numerous other configurations are possible.

In such an integrated circuit implementation, a plurality of identical die is typically formed in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various changes and modifications may be made therein by one skilled in the art without departing from the scope of the invention. It is also possible for the illustrative embodiments of the present invention to be implemented as a software program or any other logical method to process information.

What is claimed is:

1. A method for synchronizing a first clock of a transmit node with a second clock of a receive node in a packet transfer network, comprising the steps of:

generating receive time stamps for transferred packets at a receive node in accordance with the second clock;

filtering propagation delay variation from receive time stamp intervals through a first filter in accordance with a frequency of the second clock;

inputting the filtered receive time stamp intervals and transmit time stamp intervals of the transferred packets into a phase locked loop, the phase locked loop having a second filter comprising a loop filter, to generate a new frequency for the second clock; and updating the first filter and the second clock in accordance with the new frequency for synchronization with the first clock of the transfer node.

2. The method of claim 1, wherein the step of generating receive time stamps comprises the step of determining receive time stamp intervals in accordance with the receive time stamps and the second clock.

3. The method of claim 1, further comprising the step of repeating the generating, filtering, inputting and updating steps for additional transferred packets.

4. The method of claim 1, wherein, in the filtering step, the first filter comprises a low pass filter.

5. The method of claim 4, wherein, in the filtering step, the low pass filter comprises a double exponentially weighted moving average filter.

6. The method of claim 5, wherein, in the filtering step, the double exponentially weighted moving average filter comprises at least one of one or more weight factors, one or more delay blocks, and one or more state machines.

7. The method of claim 1, wherein, in the inputting step, the phase locked loop comprises a digital phase locked loop.

8. The method of claim 7, wherein, in the inputting step, the digital phase locked loop comprises a phase detector, the loop filter and a numerically controlled oscillator.

9. An article of manufacture for synchronizing a first clock of a transmit node and a second clock of a receive node in a packet network, comprising a non-transitory machine readable medium containing one or more programs which when executed implement the steps of claim 1.

10. The method of claim 1, wherein the updating step comprises applying a control signal from an output of the phase locked loop to a control input of the first filter to dynamically adjust a bandwidth of the first filter.

11. An integrated circuit device in a receive node for synchronizing a first clock of a transmit node and a second clock of the receive node, wherein the integrated circuit device is configured to: generate receive time stamps for transferred packets at a receive node in accordance with the second clock; filter propagation delay variation from receive time stamp intervals through a first filter in accordance with a frequency of the second clock; input the filtered receive time stamp intervals and transmit time stamp intervals of the transferred packets into a phase locked loop to generate a new frequency for the second clock, the phase locked loop having a second filter comprising a loop filter; and update the first filter and the second clock in accordance with the new frequency for synchronization with the first clock of the transmit node.

12. The integrated circuit device of claim 11, wherein the integrated circuit device is further configured to determine receive time stamp intervals in accordance with the receive time stamps and the second clock.

13. The integrated circuit device of claim 11, wherein the integrated circuit device is further configured to repeat the generating, filtering, inputting and updating steps for additional transferred packets.

14. The integrated circuit device of claim 11, wherein the first filter comprises a low pass filter.

15. The integrated circuit device of claim 14, wherein the low pass filter comprises a double exponentially weighted moving average filter.

16. The integrated circuit device of claim 15, wherein, the double exponentially weighted moving average filter comprises at least one of one or more weight factors, one or more delay blocks, and one or more state machines.

17. The integrated circuit device of claim 11, wherein the phase locked loop comprises a digital phase locked loop.

18. The integrated circuit device of claim 17, wherein the digital phase locked loop comprises a phase detector, the loop filter and a numerically controlled oscillator.

19. A receive node comprising:
   a clock generator for generating a first clock;
   a processor configured to generate receive time stamps for transferred packets at the receive node in accordance with the first clock;
   a first filter configured to filter propagation delay variation from receive time stamp intervals in accordance with a frequency of the first clock; and
   a phase locked loop configured to receive the filtered receive time stamp intervals and transmit time stamp intervals of the transferred packets and generate a new frequency for the first clock, the phase locked loop having a second filter comprising a loop filter, wherein the first filter and the first clock are updated in accordance with the new frequency for synchronization with a clock of a transmit node.

20. A packet transfer system comprising:
   a transmit node comprising the first clock generator for generating a first clock; and
   a receive node comprising:
      a clock generator for generating a second clock;
      a processor configured to generate receive time stamps for transferred packets at the receive node in accordance with the second clock;
      a first filter configured to filter propagation delay variation from receive time stamp intervals in accordance with a frequency of the second clock; and
      a phase locked loop configured to receive the filtered receive time stamp intervals and transmit time stamp intervals of the transferred packets and generate a new frequency for the second clock, the phase locked loop having a second filter comprising a loop filter, wherein the first filter and the second clock are updated in accordance with the new frequency for synchronization with the first clock of a transmit node.

* * * * *